US007109720B2

(12) United States Patent
Baurand et al.

(10) Patent No.: US 7,109,720 B2
(45) Date of Patent: Sep. 19, 2006

(54) METHOD FOR DETERMINING WEAR OF A SWITCHGEAR CONTACTS

(75) Inventors: Gilles Baurand, Montesson la Borde (FR); Jean-Christophe Cuny, Malakoff (FR); Stephane Delbaere, Paris (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 0 days.

(21) Appl. No.: 10/498,348

(22) PCT Filed: Dec. 17, 2002

(86) PCT No.: PCT/FR02/04413

§ 371 (c)(1),
(2), (4) Date: Jan. 14, 2005

(87) PCT Pub. No.: WO03/054895

PCT Pub. Date: Jul. 3, 2003

(65) Prior Publication Data

US 2005/0122117 A1 Jun. 9, 2005

(30) Foreign Application Priority Data

Dec. 21, 2001 (FR) .................................. 01 17104

(51) Int. Cl.
*G01R 31/02* (2006.01)
*G01R 31/327* (2006.01)

(52) U.S. Cl. ...................................... 324/421; 324/423

(58) Field of Classification Search ................ 324/421, 324/419, 420, 422, 423, 456, 654, 71.2, 699, 324/418, 415, 424, 522, 512, 500, 71.1, 76.11; 340/638, 644; 361/87

See application file for complete search history.

(56) References Cited

U.S. PATENT DOCUMENTS

| | | | | | |
|---|---|---|---|---|---|
| 4,319,193 | A | * | 3/1982 | Boccali et al. | 324/418 |
| 4,532,499 | A | * | 7/1985 | Collin et al. | 340/644 |
| 4,780,786 | A | * | 10/1988 | Weynachter et al. | 361/87 |
| 5,488,530 | A | * | 1/1996 | De Jong | 361/6 |
| 5,648,917 | A | * | 7/1997 | Ebersohl et al. | 702/186 |
| 5,844,331 | A | * | 12/1998 | Kieser et al. | 307/137 |
| 6,225,807 | B1 | | 5/2001 | Pohl | |
| 6,313,636 | B1 | * | 11/2001 | Pohl et al. | 324/421 |
| 6,359,440 | B1 | * | 3/2002 | Pohl et al. | 324/423 |
| 6,466,023 | B1 | * | 10/2002 | Dougherty et al. | 324/424 |
| 6,522,247 | B1 | * | 2/2003 | Maruyama et al. | 340/506 |

FOREIGN PATENT DOCUMENTS

| | | |
|---|---|---|
| DE | 19734224 | 2/1999 |
| WO | 97/28548 | 8/1997 |

* cited by examiner

*Primary Examiner*—Vincent Q. Nguyen
*Assistant Examiner*—Hoai-An D. Nguyen
(74) *Attorney, Agent, or Firm*—Oblon, Spivak, McClelland, Maier & Neustadt, P.C.

(57) ABSTRACT

In a switching device, a method and device for determining the wear of the pole contacts (C1, C2, C3) actuated by an electromagnet (20) whose movement is controlled by an excitation coil (21) by the variation of a contact wear distance travel time (Tu) generated during an electromagnet closing movement, by measuring at least one electrical signal (Ip) representing the conducting state of at least one power pole, by measuring an excitation current (Is) passing through the coil (21) of the electromagnet and by comparing the electrical signal (Ip) and the excitation current (Is) as a function of time. The measured wear distance travel time (Tu) can then be compared with an initial travel time (Ti) stored in the switching device.

17 Claims, 2 Drawing Sheets

METHOD FOR DETERMINING WEAR OF A SWITCHGEAR CONTACTS

DESCRIPTION

Figure 1:
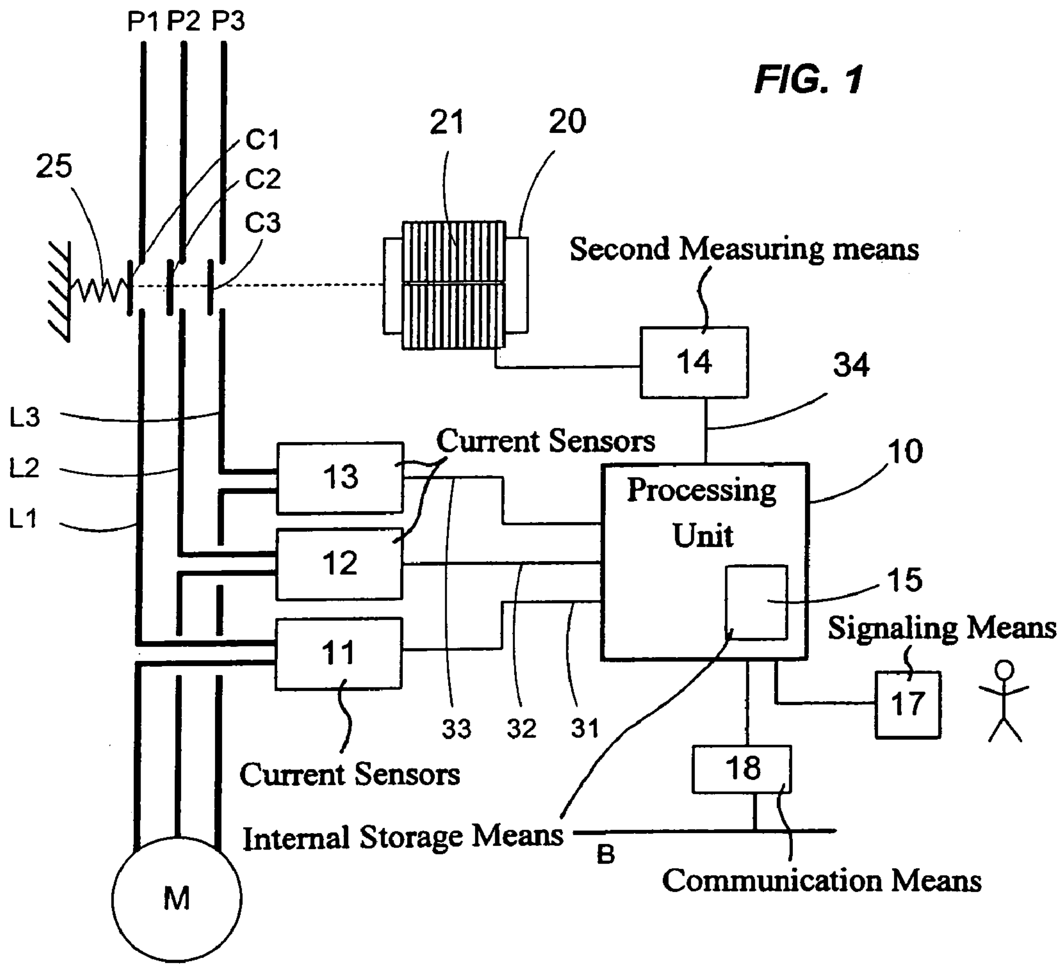

This invention relates to a method for determining the wear of the pole contacts in a power switching device provided with one or several power poles, particularly in a contactor, a starter or a discontactor, or a contactor breaker. The invention also relates to a switching device capable of using such a method.

A switching device has fixed contacts and movable contacts on each power pole, in order to switch an electrical load to be controlled. Disks mounted on these contacts wear at variable rates during each switching operation, depending on the current or voltage load. After a large number of switching operations, this wear can cause a failure of the switching device, and the consequences of this failure may be serious in terms of safety and availability. One solution frequently used to prevent this type of consequence is to systematically replace either the contacts or the switching device as a whole, after a predetermined number of operations (for example a million operations) without examining the real wear of the contact disks. The result may be that work is done too late if the disks are already excessively worn, or earlier than necessary if the disks are not yet sufficiently worn. Therefore, the ability to determine the real wear of contacts in order to deduce information related to the residual life of the contact poles, or to know when they have reached the end of their lives would be appreciable in the case of a switching device performing a large number of operations since it would provide a means of alerting the user at the right time, and thus prevent failures or defects that could occur in an automation installation.

Documents EP0878015 and EP0878016 determine the residual life of contacts by calculating a modification of the contact pressure during a contact opening operation. The change to the contact pressure is determined by measuring the time between the initial instant at which the movement of the control electromagnet armature starts and the final instant at which the contact is open. The initial instant is detected using an auxiliary circuit that analyses the voltage at the terminals of the electromagnet coil during the opening phase. The final instant is at the beginning of opening of the most severely worn switching pole contacts and is detected by connecting all phases to a detection circuit and measuring the switching voltage as the variation of the voltage at an artificial neutral point on the output side power lines.

Nevertheless, the fact that these devices work while opening introduces the presence of an electrical arc that can disturb voltage measurements in the poles. These devices also require special precautions to measure the coil voltage, such as the use of an auxiliary switch that has to be added to isolate the auxiliary circuit from the coil power supply so as to measure the coil voltage in a discharge resistance.

The purpose of this invention is to determine wear of pole contacts in a switching device as simply as possible, while avoiding these disadvantages. To achieve this, the invention describes a process to determine wear of pole contacts in a switching device that comprises one or several power poles provided with contacts actuated by a control electromagnet, for which the movement between an open position and a closed position is controlled by an excitation coil, wear of the contacts being determined starting from a contact wear distance travel time. According to the invention, the contact wear distance travel time is generated during an electromagnet closing movement, by measuring at least one electrical signal representing the conducting or non conducting state of at least one power pole, by measuring an excitation current passing through the coil of the electromagnet, and by calculating the time interval between a contact closing instant determined from said electrical signal, and a final instant of the electromagnet closing movement, determined from said excitation current.

According to one characteristic, the contact closing instant is determined by the appearance of the electrical signal when the pole becomes conducting, and the end of the electromagnet closing movement determined by the detection of a minimum excitation current.

According to another characteristic, the closing instant of the contacts of each power pole is determined by the appearance of a principal current circulating in the corresponding power pole in the switching device. According to another characteristic, the closing instant of the contacts of a power pole is determined by the appearance of a phase/neutral voltage on the output side of the contacts, between the corresponding power pole and a neutral point. According to another characteristic, the closing instant of the contacts of power poles is determined by the appearance of a phase/phase voltage between two power poles, on the output side of the contacts.

There are advantages in working when the contacts are closed, in other words when the electromagnet is energised, rather than when the contacts are open. Firstly, it avoids disturbances that occur during opening, particularly related to the electrical arc at contacts and the residual magnetic flux in the coil. Therefore, this simplifies the measurement of a current or a voltage in the poles of the device to detect the contact closing instant. Furthermore, in a switching device with an electronically controlled coil, the coil excitation current is already measured at the time of closing, while the electromagnet is energised, although this is not necessarily measured during opening. Therefore, this measurement of the excitation current can also easily be used to detect the end of the electromagnet closing movement.

The measured wear distance travel time, possibly corrected by a correction coefficient, is used to determine the wear of contacts starting from the drift of this travel time measured with respect to an initial wear distance travel time stored in the switching device storage means. Contact wear can thus be determined starting from a comparison of the measured wear distance travel time with a minimum acceptable wear distance travel time stored in the storage means of the switching device.

The invention also describes a switching device capable of implementing this method. This type of switching device comprises first measuring means outputting at least one primary signal representing the conducting or non conducting state of at least one power pole, second measuring means outputting a secondary signal representing an excitation current circulating in the coil of the electromagnet, and a processing unit into which the primary signal(s) and the secondary signal are input to implement the method. The first measuring means are placed in series on current lines of the switching device, in order to measure the principal currents circulating in the power poles. Alternately, the first measuring means may be placed between output side current lines and a neutral point on the switching device, in order to measure phase/neutral voltages of the power poles.

According to another characteristic, the switching device comprises means for storage of an initial contact wear distance travel time. The processing unit calculates a measured contact wear distance travel time and compares the said measured distance travel time with the initial stored distance travel time, in order to determine a residual life of the contacts and/or to provide end of life information beyond which the performances of the product are no longer guaranteed.

Figure 2:
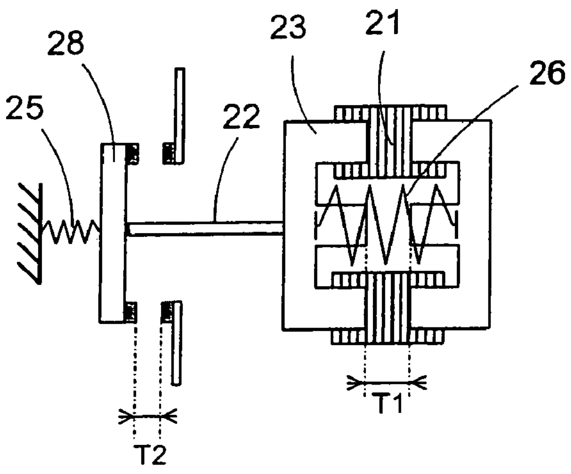
Figure 3:
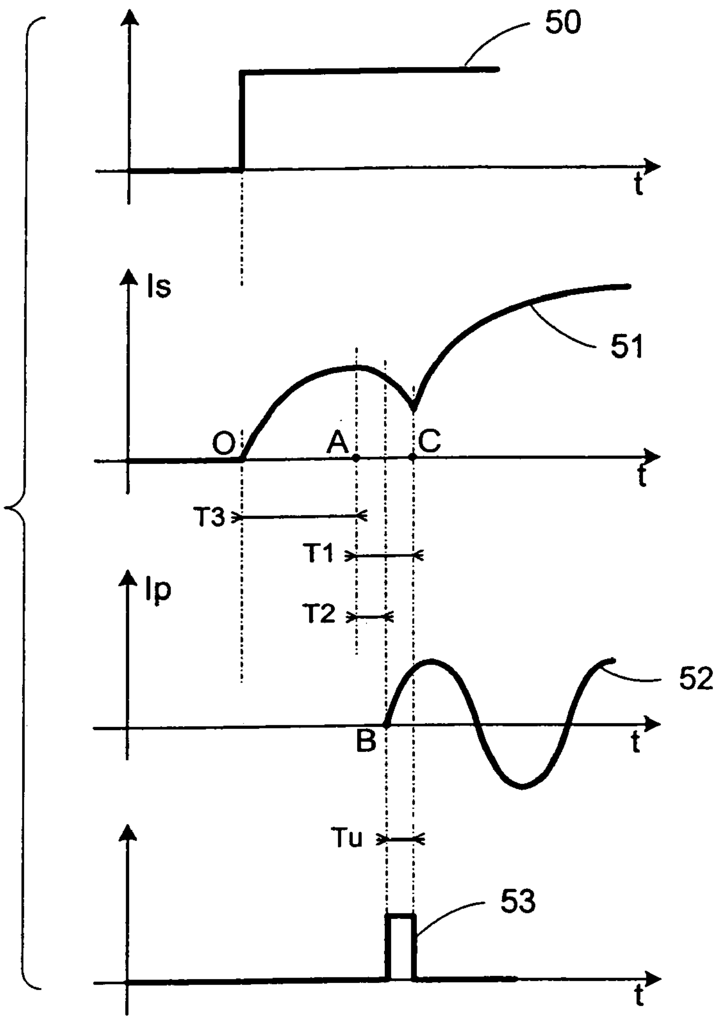
Figure 4:
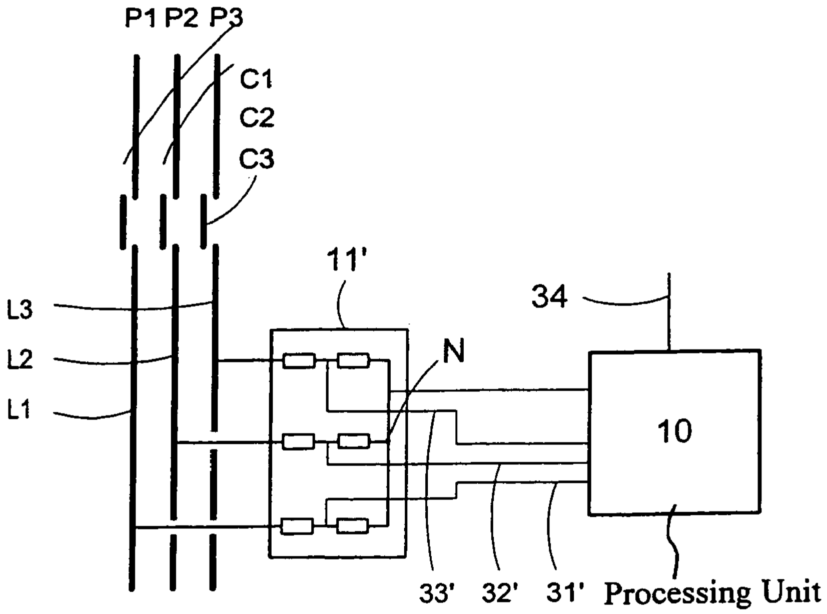

Other characteristics and advantages will become clear from reading the detailed description given below with reference to an embodiment given as an example and represented by the appended figures, wherein:

FIG. 1 shows a functional diagram of a switching device according to the invention comprising first current measuring means, FIG. 2 gives simplified details of the operation of a contacts pole in a switching device shown in FIG. 1, FIG. 3 is a series of diagrams showing the variation of the principal currents and the excitation current during a closing movement of the switching device shown in FIG. 1, FIG. 4 shows details of an alternative to FIG. 1 with first voltage measuring means.

An electric switching device, for example such as a contactor, contactor breaker or starter (discontactor), comprises one or several power poles. In the example shown in FIG. 1, the switching device comprises three power poles P1, P2 and P3.

The switching device comprises input side current lines (source lines) that set up electrical continuity between the electrical power supply network and the poles P1, P2, P3, and input side current lines L1, L2, L3 (load lines) that set up electrical continuity between the poles of the switching device and an electric load, usually an electric motor M, that is to be controlled and/or protected using the switching device. Input side current lines are connected or disconnected from output side current lines by pole contacts C1, C2, C3. Contacts C1, C2, C3 comprise movable contacts arranged on a movable bridge 28, and fixed contacts, in a known manner. The movable bridge 28 is actuated by a control electromagnet 20 and by a contact pressure spring 25. The control electromagnet 20 comprises a fixed yoke, a movable armature 23, a return spring 26 and an excitation coil 21. The closing movement of the movable armature 23 of the electromagnet 20 is generated by passing an excitation current Is in the excitation coil 21. Preferably, the excitation coil 21 is powered by a DC excitation voltage.

A switching device with breaking poles has been shown in the detailed embodiment shown in FIG. 2, but it would be equally possible to envisage a device with contactor poles. The operation of a device with breaking poles is as follows: when no excitation current Is circulates in the coil 21 of the electromagnet, the return spring 26 causes separation between the movable armature 23 and the fixed yoke of the electromagnet. The movable armature 23 cooperates mechanically with a mechanical link 22 not shown in detail here (such as a press rod) so as to act on the movable bridge 28, thus opening contacts by separating the movable contacts from the fixed contacts. The return spring 26 cannot do this unless its force is greater than the force of the contact pressure spring 25. The appearance of an excitation current Is in the excitation coil 21 causes inverse displacement of the movable armature 23 towards the fixed yoke of the electromagnet 20, thus releasing the movable bridge 28. The contact closing force is then provided by the contact pressure spring 25 that bears on the movable bridge 28 to force the movable contacts firmly into contact with the fixed contacts. In particular, a device with breaking poles has the advantage that it reduces risks of bounce at the end of the contact closing movement, since the inertia of the moving movable bridge is globally reduced because the movable bridge 28 is separated from the movable armature 23 of the electromagnet at this moment.

In a switching device with breaking poles, contact disks can be made thick enough so that the end of the product life is not the result of the disks being too thin, but rather because the remaining wear travel distance of the contacts is too small. When this wear travel distance becomes zero, the press rod 22 will still be in contact with the movable bridge 28 when the movable armature 23 has finished its closing movement, which hinders the pressure force to be applied by the spring 25 to bring the movable contacts into contact with the fixed contacts. Since the contact pressure is no longer sufficient, under these conditions it is no longer possible to guarantee that the switching device will work properly. Thus, contact wear may depend on the remaining wear travel distance of the contacts, rather than the remaining thickness of the disks.

According to the invention, the switching device comprises first measuring means 11, 12, 13, 11' capable of outputting at least one primary signal measuring at least one electrical signal representing the conducting or non-conducting state of at least one power pole P1, P2, P3. In the embodiment shown in FIG. 1, the said first measuring means include current sensors 11, 12, 13 installed in series on each output side current line L1, L2, L3 and each outputting a primary signal 31, 32, 33 respectively, depending on the principal current Ip circulating in each pole P1, P2 and P3 respectively of the switching device. Normally, these current sensors 11, 12 and 13 are used particularly to perform thermal fault, magnetic fault or short circuit fault protection functions in a contactor breaker. For example, current sensors 11, 12 and 13 may be Rogowski type current sensors. In this case, the primary signal obtained is actually an image of the derivative of the current Ip, so that a large signal is possible immediately that the current appears, thus facilitating detection of the instant at which the current Ip appears.

In the alternate embodiment shown in FIG. 4, the first measuring means 11' are placed on the output side of the contacts C1, C2, C3, between the output side current lines L1, L2, L3 and a virtual neutral point N of the switching device, so as to output primary signals 31', 32' and 33' respectively that depend on the phase/neutral voltage of the different power poles P1, P2, P3 respectively. This alternate solution is simpler to implement in devices without current sensors. In the simplified example in FIG. 4, the measuring means 11' comprise a first high resistance bypassing each measured pole in order to lower the current intensity, placed in series with a second resistance for which the voltage is measured at the terminals. The ends of the two second resistances are connected to the neutral point N. Other similar voltage measurement systems exist. Therefore, after analogue processing if necessary, the measuring means 11' generate primary signals 31', 32', 33' representing the phase/neutral voltages of the different poles. In another alternate embodiment, it would also be possible to use first measuring means capable of measuring a phase/phase voltage between two power poles.

The primary signals 31, 32, 33 or 31', 32', 33' are sent to a processing unit 10 of the switching device. This processing unit 10 may for example be installed in an ASIC type integrated circuit installed on a printed circuit inside the switching device. In particular, it can be used to control the control electromagnet 20 and, in the case of a contactor breaker, to control a thermal and/or magnetic trip device.

The switching device also comprises second measuring means 14 to measure the excitation current Is circulating in the excitation coil 21 of the electromagnet 20. Since the coil 21 is powered in DC voltage, the second measuring means 14 may be composed of a resistance connected in series on the control circuit of the coil 21, for which the voltage at the terminals is measured directly. Therefore after analogue processing of this measurement, the measuring means 14 generate a secondary signal 34 representative of the excitation current Is sent to the processing unit 10.

In the case of a contactor/circuit breaker type switching device that is already provided with current sensors 11, 12 and 13 measuring the principal currents Ip to protect an electric load, these same current sensors may advantageously be used in the context of this invention to also determine the time that the contacts C1, C2 and C3 are closed. Moreover, if such a contactor breaker device already includes an electronic processing unit 10 particularly designed to control a control electromagnet 20, this processing unit 10 also has information 34 representative of the excitation current Is. It is then easy and economic to integrate a process for determination of the contact wear as described in the invention into such a switching device, so as to be able to alert the user at the required moment and thus prevent failures or faults of the switching device.

With reference to FIG. 3, the process used in the processing unit 10 is based on the following principle:

When an order 50 to close the contacts appears, the excitation current Is shown diagrammatically by curve 51 sent to the coil 21 of the electromagnet 20 starts to increase. During this separation phase, the movable armature 23 of the electromagnet 20 does not move and the excitation current Is increases along an approximately asymptotic curve.

At instant A, the excitation coil 21 has stored a sufficient number of amperes-turns to make the closing movement of the movable armature 23 start. Starting from this instant, the air gap of the electromagnet 20 will progressively reduce, which will cause a variation in the reluctance of the magnetic circuit composed of the fixed yoke and the movable armature 23 of the electromagnet 20. This variation of the reluctance causes a drop in the excitation current Is. This drop in the excitation current Is continues until an instant C corresponding to the end of the travel distance of the movable armature 23, in other words, the end of the closing movement of the electromagnet 20. After instant C, the air gap and therefore the reluctance of the electromagnet no longer vary and the excitation current Is increases again, as shown on curve 51.

At the same time, starting from instant A, the movement of the movable armature progressively releases movable bridge 28 which is then entrained by the contact pressure spring 25. The movable bridge 28 then starts moving until instant B at which the movable contacts of each power pole will be forced into contact with the corresponding fixed contacts, bringing the pole into the conducting state. Starting from this instant B, a principal current Ip measured by the different current sensors 11, 12, 13 will appear, as shown diagrammatically by curve 52. If each pole comprises two fixed contacts and two movable contacts as shown in FIG. 2, instant B advantageously corresponds to closing of the two pairs of fixed/movable contacts, which will make it possible to detect the greatest wear of the disks in the two pairs of contacts in the same pole. In the alternate embodiment in FIG. 4, instant B can be determined on each pole by the appearance of a phase/neutral voltage on the output side of the contacts, measured by the first measuring means 11' between a pole and the virtual neutral N. Similarly, the instant B can also be detected using a phase/phase voltage measurement between the two poles of the device on the input side of the contacts.

Thus, the processing unit 10 is capable of detecting the end of the electromagnet closing movement corresponding to instant C, by detecting the appearance of a minimum value of the excitation current Is represented by a turning point on the curve Is in FIG. 3, starting from the received secondary signal 34. Moreover, the processing unit 10 is also capable of detecting the contact closing instant, corresponding to instant B, by detecting the appearance of electrical signals representing the conducting or non conducting state of the poles (in other words, either the principal current Ip, or the phase/neutral voltage, or the phase/phase voltage) starting from the primary signal(s) 31, 32, 33 or 31, 32', 33'. The processing unit 10 can compare variations of the electrical signal(s) and the excitation current Is as a function of time, and use these variations to determine the contact wear distance travel time.

The time T1 between instant A and instant C corresponds to the duration of the closing movement of the electromagnet movable armature 23. The time T2 between instant A and instant B corresponds to the duration of the closing movement of the movable bridge 28. The difference (or the time interval) between T1 and T2, called Tu, corresponds to the travel time necessary to travel the contact wear distance (also called the contact compression travel distance), between instant B and instant C, shown diagrammatically on diagram 53. It is obvious that the time T2 increases as the wear of the fixed and/or movable contact disks increases, and therefore the time Tu reduces.

To avoid occasional inaccuracies in measurements and the calculation of time Tu, the processing unit 10 could optionally perform filtering or smoothing, particularly only using average values calculated from several measurements made on a given number of electromagnet closing cycles, for example of the order of several tens of cycles.

The information related to contact wear may indifferently comprise information related to the residual life of the contacts expressed as a percentage, wear degrees, etc., and/or alert information indicating the end of life of the contacts of the switching device.

In order to produce information related to the residual life of the contacts, the processing unit 10 compares the measured contact wear distance travel time Tu with initial travel time Ti corresponding to an initial wear distance of the contact (also called the compression distance in the new state) and monitors the variation in time or the evolution of the difference between Tu and Ti. This initial travel time Ti corresponds to a calibration value determined for a given type of electromagnet.

In order to produce end of contact life alert information, the processing unit 10 compares the measured contact wear distance travel time Tu with a minimum travel time Tmin corresponding to a minimum acceptable contact wear distance below which it is no longer possible to guarantee the expected performances of the switching device. This minimum travel time Tmin is also determined for a given type of electromagnet.

The switching device then has internal storage means 15 connected to the processing unit 10 capable of storing this initial value Ti and/or this minimum value Tmin. The storage means 15 may for example consist of a non-volatile EEPROM type memory or a Flash type memory. Advantageously, for cost and dimensional reasons, the processing unit 10 and the storage means 15 are installed in the same integrated circuit in the switching device. The initial value Ti is stored in memory means 15 either with a value predetermined when the switching device is manufactured, or with a first measurement of Tu made during the first switching operations of the switching device.

In order to compare Tu with Ti and/or Tmin, it is useful to make an assumption about the real velocity of the movable part of the electromagnet during the contact closing distance. For example Ti and Tmin could be determined from a nominal velocity of the movable part 23 of the electromagnet, and this nominal velocity is not necessarily identical to the rear velocity used to determine Tu.

In a first simplified variant, it is considered that the displacement velocity of the movable armature 23 remains approximately constant for a given type of electromagnet with a given rating. In this case, the processing unit 10 can monitor the derivative of the difference between the measured travel time Tu and the initial travel time Ti, and is easily capable of calculating the residual life of the contacts. Similarly, the processing unit 10 is easily capable of giving end of contact life information when Tu drops below Tmin, without requiring a correction to the measurement of Tu.

In a second variant, it is considered that the displacement velocity of the movable armature 23 depends not only on the type of electromagnet, but also on the power supply voltage of the excitation coil (or at least the average power supply voltage seen by the coil in the case of a switching order). As the power supply voltage increases, the real displacement velocity of the movable armature 23 may increase during the closing movement. In this case, the switching device is provided with means of measuring this power supply voltage. These means are connected to the processing unit 10, so that it can assign a correction coefficient to the measured travel time Tu taking account of velocity variations, before making a comparison with Ti and/or Tmin, so as to obtain better precision in generation of the information related to contact wear.

In a third variant, it is considered that the displacement velocity of the movable armature 23 also depends on other parameters such as the device operating temperature. Nevertheless, the process should not be penalised with calculations that would become too complex. This is why in this case, the processing unit calculates a duration of the separation phase T3 (see FIG. 3) corresponding to the time elapsed between a time O at which a current Is appears in the coil, and the instant at which the maximum current Is occurs at the beginning of the movement of the movable armature 23, in order to more precisely estimate the displacement velocity of the movable armature 23. This duration T3 is also a function of the operating temperature of the device and the power supply voltage of the coil, consequently a simple correlation can be made between the variation of the duration T3 and the variation of the velocity of the movable armature. By comparing the measured duration T3 with a stored reference duration, a correction factor can be assigned to the measured travel time Tu, taking account of velocity variations in order to obtain a better precision in generating the information related to wear of the contacts.

The switching device also comprises communication means 18 to connect it to a communication bus B such as a serial link, a field bus, a LAN, a global network (of the Intranet or Internet type) or other. These communication means 18 are connected to the processing unit 10 so that information related to wear of pole contacts calculated by the processing unit 10 can be transmitted on the communication bus B. The switching device also comprises signalling means 17 connected to the processing unit 10. These signalling means 17, such as a mini screen or several lights on the front of the switching device, enable an operator located close to the switching device to display information related to wear of pole contacts calculated by the processing unit 10.

Furthermore, in the case in which the processing unit 10 is required to issue an order to control the control electromagnet 20, the processing unit 10 is capable of slaving this order to an end of pole contact life information, so as to be able to eliminate the possibility of issuing an order to close power poles with the switching device if the contact wear is too high, since it would then no longer be possible to guarantee the announced performances of the switching device. Thus, this provides an additional very valuable safety function, since the switching device can lock itself if there is any risk of malfunction.

In one preferred embodiment, the switching device is provided with a current sensor 11, 12 and 13 for each of its power poles P1, P2 and P3. The processing unit 10 then receives one primary signal 31, 32, 33 for each pole and is therefore capable of separately detecting contact wear on each power pole. In this case, the wear of contacts in the switching device will be calculated either pole-by-pole, or using the power poles with the most severely worn contacts.

In another embodiment, the switching device does not have a current sensor 11, 12, 13 in each power pole P1, P2, P3, but for example has a current sensor only for a single pole. The processing unit 10 then receives a single primary signal and is only capable of actually detecting wear of the contacts on this power pole. In this case, the wear of all contacts of the switching device will be determined from this single measurement for a pole, without taking account of other disparities between wear values in different poles.

Obviously, other variants and improvements to details could be envisaged and the use of equivalent means could be envisaged without departing from the scope of the invention.

The intention claimed is:

1. Method to determine wear of pole contacts in a switching device comprising one or more power poles fitted with contacts actuated by a control electromagnet whose movement between an open position and a closed position is controlled by an excitation coil, wear of the contacts being determined by using a contact wear distance travel time, wherein the contact wear distance travel time is generated during an electromagnet closing movement, comprising the steps of:

measuring at least one electrical signal representing the conducting or non-conducting state of at least one power pole, measuring an excitation current passing through the coil of the electromagnet, and calculating the time interval between a contact closing instant determined from said electrical signal and a final instant of the electromagnet closing movement determined from said excitation current.

2. Method according to claim 1, wherein the final instant of the electromagnet closing movement is determined by the detection of a minimum of the said excitation current.

3. Method according to claim 2, wherein the closing instant of the contacts is determined by the appearance of said electrical signal.

4. Method according to claim 2, wherein the closing instant of the contacts of each pole is determined by the appearance of a principal current circulating in each power pole of the switching device.

5. Method according to claim 2, wherein the closing instant of the contacts of each pole is determined by the appearance of a phase/neutral voltage between each power pole and a neutral point on the output side of the contacts.

6. Method according to claim 2, wherein the closing instant of the pole contacts is determined by the appearance of a phase/phase voltage between two power poles on the output side of the contacts.

7. Method according to one of claims 1 to 6, wherein wear of the contacts is determined by using the variation in time of the measured contact wear distance travel time compared with an initial contact wear distance travel time stored in the switching device storage means.

8. Method according to one of claims 1 to 6, wherein wear of contacts is determined by using the comparison of the measured contact wear distance travel time with a minimum acceptable contact wear distance travel time stored in the switching device storage means.

9. Switching device for determining wear of pole contacts comprising one or more power poles provided with contacts actuated by a control electromagnet whose movement between an open position and a closed position is controlled by an excitation coil, wear of the contacts being determined by using a contact wear distance travel time, wherein the contact wear distance travel time is generated during an electromagnet closing movement, wherein the switching device comprises:

first measuring means for outputting at least one primary signal representing the conducting or non-conducting state of at least one power pole;

second measuring means for outputting a secondary signal representing an excitation current circulating in the coil of the electromagnet;

a processing unit into which the primary signal(s) and the secondary signal are input to calculate the time interval between a contact closing instant determined from said electrical signal and a final instant of the electromagnet closing movement determined from said excitation current.

10. Switching device according to claim 9, wherein the first measuring means are placed in series on current lines of the switching device, in order to measure the principal currents circulating in the power poles.

11. Switching device according to claim 9, wherein first measuring means are placed between output side current lines and a neutral point on the switching device, in order to measure phase/neutral voltages of the power poles.

12. Switching device according to either claim 10 or 11, further comprising storage means for storing an initial contact wear distance travel time.

13. Switching device according to claim 12, wherein the processing unit calculates a measured wear distance travel time of the contacts and compares said measured time with the stored initial travel time to determine information related to wear of pole contacts.

14. Switching device according to claim 13, wherein the processing unit and the storage means are installed in an integrated circuit in the switching device.

15. Switching device according to claim 13, further comprising communication means connected to the processing unit so that information related to wear of pole contacts can be transmitted on a communication bus.

16. Switching device according to claim 13, further comprising signalling means connected to the processing unit to display information related to wear of pole contacts.

17. Switching device according to claim 13, in which the processing unit outputs an order to the electromagnet, wherein the processing unit is capable of slaving the order to control the electromagnet to information related to wear of pole contacts.

* * * * *